(12) United States Patent
Wang et al.

(10) Patent No.: US 9,048,301 B2
(45) Date of Patent: Jun. 2, 2015

(54) NANOWIRE MOSFET WITH SUPPORT STRUCTURES FOR SOURCE AND DRAIN

(71) Applicant: Taiwan Semiconductor Manufacturing Company Limited, Hsinchu (TW)

(72) Inventors: Chien-Hsun Wang, Hsinchu (TW); Mao-Lin Huang, Hsinchu (TW); Chun-Hsiung Lin, Hsinchu County (TW); Jean-Pierre Colinge, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/055,165

(22) Filed: Oct. 16, 2013

(65) Prior Publication Data
US 2015/0102287 A1    Apr. 16, 2015

(51) Int. Cl.
*H01L 31/00* (2006.01)
*H01L 29/775* (2006.01)
*H01L 29/66* (2006.01)
*H01L 29/06* (2006.01)

(52) U.S. Cl.
CPC ........ *H01L 29/775* (2013.01); *H01L 29/66439* (2013.01); *H01L 29/0669* (2013.01)

(58) Field of Classification Search
USPC .......................................................... 257/26
See application file for complete search history.

(56) References Cited

U.S. PATENT DOCUMENTS

| 7,709,923 | B2 | 5/2010 | Agarwal et al. |
| 7,999,251 | B2 | 8/2011 | Chu et al. |
| 8,422,273 | B2 | 4/2013 | Chang et al. |
| 8,900,951 | B1 * | 12/2014 | Cheng et al. .................. 438/280 |
| 2009/0124050 | A1 | 5/2009 | Dornel et al. |
| 2012/0319178 | A1 | 12/2012 | Chang et al. |

FOREIGN PATENT DOCUMENTS

EP    0854510 A2    7/1998

OTHER PUBLICATIONS

Doolittle, Alan; Lecture 11: Etching Techniques; ECE 6450 Presentation, Georgia Tech, GA; Date Unknown.

* cited by examiner

*Primary Examiner* — Mohammad Islam
*Assistant Examiner* — Ankush Singal
(74) *Attorney, Agent, or Firm* — Jones Day

(57) ABSTRACT

A transistor device and method for forming a nanowire field effect transistor (FET) device are provided. A device layer including a source region and a drain region is formed, where the source region and the drain region are connected by a suspended nanowire channel. Etch stop layers are formed beneath the source region and the drain region. The etch stop layers comprise support structures interposed between a semiconductor substrate and the source and drain regions. The suspended nanowire channel is formed by etching a sacrificial material beneath the suspended nanowire channel. The etching is selective to the sacrificial material to prevent the removal of the etch stop layers beneath the source region and the drain region.

23 Claims, 4 Drawing Sheets

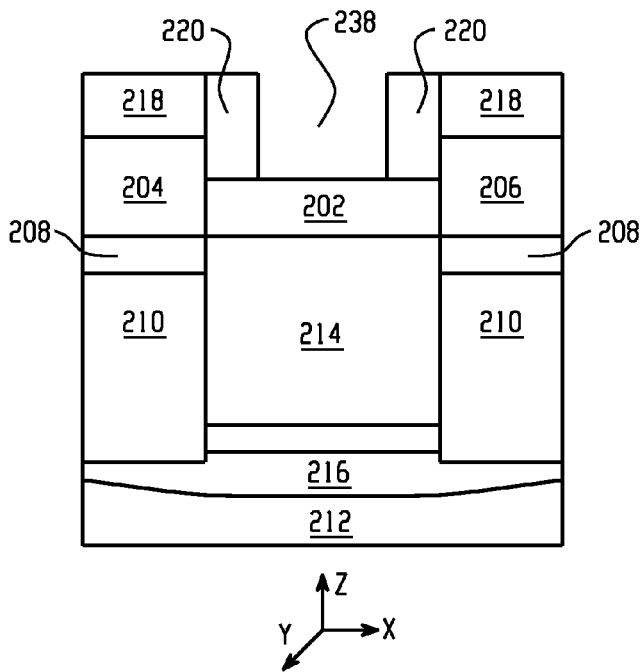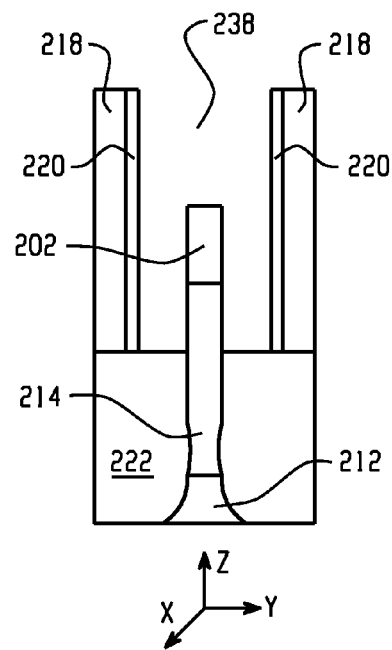
Fig. 2A    Fig. 2B
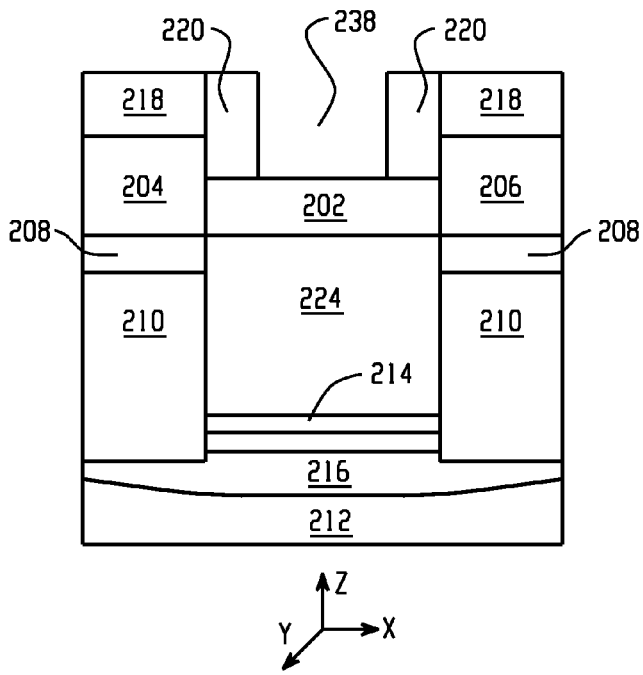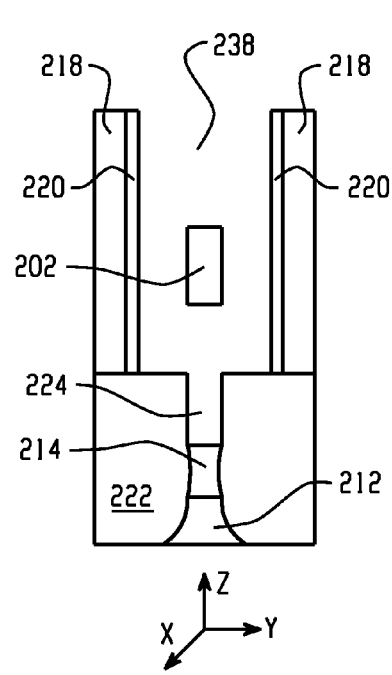
Fig. 2C    Fig. 2D

NANOWIRE MOSFET WITH SUPPORT STRUCTURES FOR SOURCE AND DRAIN

TECHNICAL FIELD

The technology described in this disclosure relates generally to nanowire-based devices and more particularly to nanowire-based field-effect transistors (FETs) and techniques for the fabrication thereof.

BACKGROUND

Gate-all-around (GAA) nanowire channel field-effect transistors (FETs) may enable feature scaling beyond current planar complementary-metal-oxide semiconductor (CMOS) technology. Nanowire channel FETs may also be of interest due to their electrostatics, which may be superior to those of conventional FET devices. The fabrication of nanowire channel FETs may include generating a collection of nanowires and placing them where desired (e.g., a bottom-up approach) or may include various lithographic patterning procedures.

SUMMARY

The present disclosure is directed to a transistor device and a method for forming a nanowire field effect transistor (FET) device. In a method for forming a nanowire FET device, a device layer including a source region and a drain region is formed, where the source region and the drain region are connected by a suspended nanowire channel. Etch stop layers are formed beneath the source region and the drain region. The etch stop layers comprise support structures interposed between a semiconductor substrate and the source and drain regions. The suspended nanowire channel is formed by etching a sacrificial material beneath the suspended nanowire channel. The etching is selective to the sacrificial material to prevent the removal of the etch stop layers beneath the source region and the drain region.

In another example, in a method for forming a nanowire FET device, a device layer is formed including a source region and a drain region, where the source region and the drain region are connected by a suspended nanowire channel. Etch stop layers beneath the source region and the drain region are formed. The etch stop layers include a carbon-doped silicon layer, a non-doped silicon layer, and a boron-doped silicon layer. The suspended nanowire channel is formed by etching a sacrificial material beneath the suspended nanowire channel. The etching is selective to the sacrificial material to prevent the removal of the etch stop layers beneath the source region and the drain region.

In another example, a transistor device includes a semiconductor substrate and a device layer including a source region and a drain region. The source region and the drain region are connected by a suspended nanowire channel. The transistor device further includes etch stop layers beneath the source region and the drain region. The etch stop layers comprise support structures interposed between the semiconductor substrate and the source and drain regions. The suspended nanowire channel is formed by etching a sacrificial material beneath the suspended nanowire channel, where the etching is selective to the sacrificial material to prevent the removal of the etch stop layers beneath the source region and the drain region.

BRIEF DESCRIPTION OF THE FIGURES

FIGS. 2A, 2B, 2C, and 2D are diagrams illustrating an example method for fabricating a nanowire-based FET with etch stop layers including a non-doped silicon layer.

DETAILED DESCRIPTION

Figure 1A:
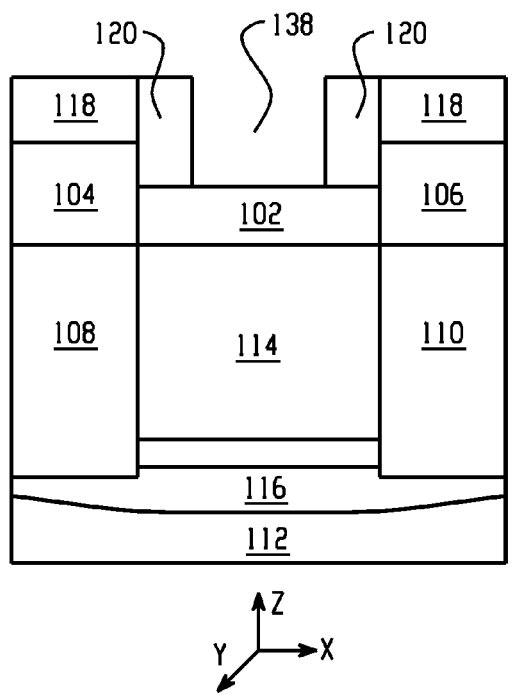
FIGS. 1A, 1B, 1C, and 1D are diagrams illustrating an example method for fabricating a gate-all-around (GAA) nanowire-based field-effect-transistor (FET).
Figure 1B:
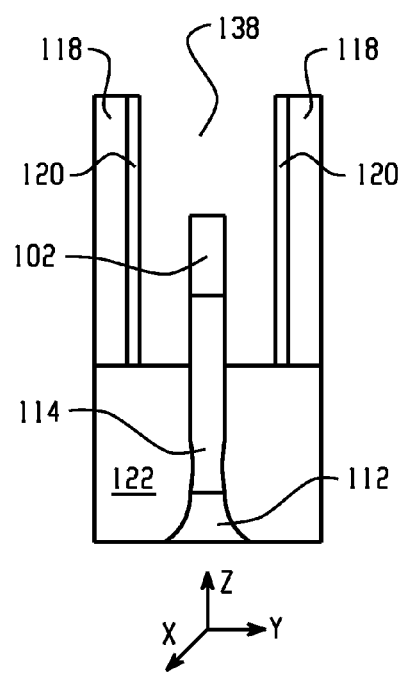
Figure 1C:
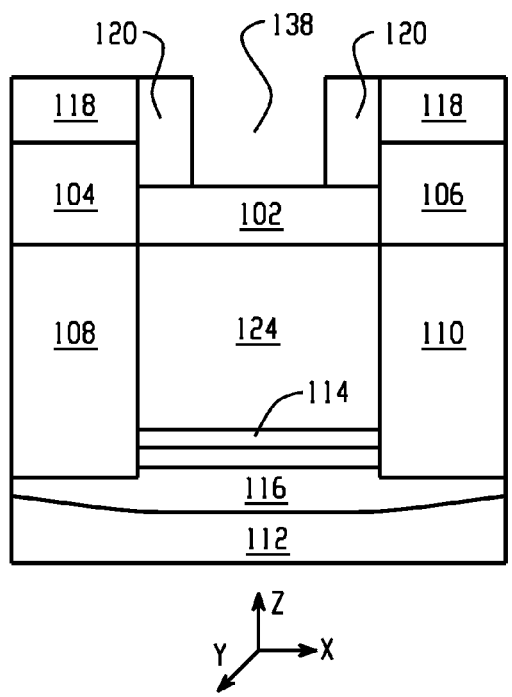

FIGS. 1A, 1B, 1C, and 1D are diagrams illustrating an example method for fabricating a gate-all-around (GAA) nanowire-based field-effect-transistor (FET). As depicted in FIGS. 1A and 1C, the nanowire-based FET may include a source region 104, a drain region 106, and a nanowire channel 102 that connects the source and drain regions 104, 106. The source region 104 and the drain region 106 may each comprise silicon phosphide (SiP), among other materials. The nanowire channel 102 may comprise a silicon nanowire, among other types. In a completely fabricated state, a gate (not depicted in FIGS. 1A-1D) may surround (e.g., wrap) the nanowire channel 102, where the gate may be used to regulate current flow through the nanowire channel 102 between the source and drain regions 104, 106.

FIG. 1A may depict a cross-sectional view of an example intermediate stage in the fabrication of the nanowire-based FET. In particular, FIG. 1A may depict the state of the FET after removal of a dummy gate structure, where removal of the dummy gate structure defines a trench 138 that distinguishes the nanowire channel 102 from the source and drain regions 104, 106 of the device. As depicted in FIG. 1A, interlayer dielectric (ILD) layers 118 may be formed above the source and drain regions 104, 106. Optional spacers 120 may be formed in the trench 138, where the spacers 120 may be disposed between the source and drain regions 104, 106 and the device gate to be formed in the trench 138. The spacers 120 may be used to minimize parasitic capacitance in the completed device and may prevent gate-to-source/drain shorting, among other functions. The spacers 120 may also serve to offset the gate a certain distance from the source and drain regions 104, 106.

A sacrificial layer 114 may be formed beneath the nanowire channel 102, where the sacrificial layer 114 is formed substantially over a semiconductor substrate. The semiconductor substrate may include a well 112 of a first conductivity type (e.g., P-type or N-type), where the well 112 may be formed via an ion implantation process. For example, the semiconductor substrate may be a bulk N-type silicon wafer, and the well 112 may be a P-type well. Conversely, the semiconductor substrate may be a bulk P-type silicon wafer, and the well 112 may be an N-type well. In other examples, the well 112 may be of the same conductivity type as the semiconductor substrate. Further, in other examples, the semiconductor substrate may be a semiconductor-on-insulator or silicon-on-insulator (SOI) substrate. In the well 112, an anti-punch-through (APT) layer 116 may be formed via an implantation process. The APT layer 116 may be used to reduce punch through in the FET device (e.g., where zero gate-bias drain current increases with increasing $V_{DS}$), and the APT layer 116 may be of the first conductivity type or a second conductivity type. Thus, the sacrificial layer 114 may be formed substantially over the well 112 and the APT layer 116 of the semiconductor substrate.

The nanowire channel 102 may be released from the semiconductor substrate (e.g., to form a suspended nanowire channel 102) by etching the sacrificial layer 114 beneath the nanowire channel 102. This is depicted in FIG. 1C, where the sacrificial layer 114 has been etched away, thus leaving a void region 124 in the place of the sacrificial layer 114. The sacrificial layer 114 may include, for example, silicon germanium (SiGe), where the germanium may comprise 20-55% of the SiGe alloy (e.g., $Si_{1-x}Ge_x$, where x is within a range of approximately 20-55%). The sacrificial layer 114 may be etched to form the void region 124 of FIG. 1C using a chemical etchant or using a dry etch process, for example.

FIGS. 1A and 1C further depict etch stop layers 108, 110 that may be formed beneath the source and drain regions 104, 106 of the structure. The etch stop layers 108, 110 may comprise support structures that are located between the semiconductor substrate and the source and drain regions 104, 106, where the structures support the source and drain regions 104, 106 before and after the etching of the sacrificial layer 114. The etch stop layers 108, 110 may be comprised of, for example, carbon-doped silicon. The carbon-doped silicon for the etch stop layers 108, 110 may be formed using an epitaxial growth process.

The etch stop layers 108, 110 may be selected to include materials that have a high etch rate selectivity with the sacrificial layer 114. Etch rate selectivity may be defined as the ratio of the etch rate of a target material (i.e., here, the sacrificial layer 114 to be etched) to the etch rate of other materials (i.e., here, the etch stop layers 108, 110 that are preferably not etched during the etching of the sacrificial layer 114). Thus, the etch stop layers 108, 110 may be selected such that when the sacrificial layer 114 is etched to suspend the nanowire channel 102, the etch stop layers 108, 110 are etched at a substantially lower etch rate as compared to that of the sacrificial layer 114. There may be a high etch rate selectivity between carbon-doped silicon and SiGe, such that carbon-doped silicon may be a suitable material for the etch stop layers 108, 110 when SiGe is used as the sacrificial layer 114. The use of the etch stop layers 108, 110 may prevent etch undercutting beneath the source and drain regions 104, 106 during the removal of the sacrificial layer 114.

In conventional fabrication techniques for nanowire-based FET devices that do not employ the etch stop layers 108, 110, the sacrificial layer 114 may extend beneath the source and drain regions 104, 106. In such conventional fabrication techniques, when etching the sacrificial layer 114, etch undercutting may occur under the source and drain regions 104, 106. The etch undercutting may cause etching of the sacrificial layer 114 beneath the source and drain regions 104, 106, which may be undesirable and may cause the source and drain regions 104, 106 to lack structural support. For example, in the conventional fabrication techniques, the etch may be isotropic, thus causing significant undercutting under the source and drain regions 104, 106. By employing the etch stop layers 108, 110, the etching may be selective to the sacrificial layer 114 to substantially prevent the removal of the etch stop layers 108, 110 and to substantially prevent the undercutting beneath the source and drain regions 104, 106.

The etch stop layers 108, 110 may provide other functionality in the fabrication of the nanowire-based FET device. For example, in forming the FET device, high temperature processes may be used (e.g., high temperature gate rounding and oxidation processes, for example). The high temperature processes may cause the SiP of the source and drain regions 104, 106 to diffuse downward (e.g., top-to-bottom diffusion). In example structures where the etch stop layers 108, 110 include carbon-doped silicon, the etch stop layers 108, 110 may serve as SiP diffusion stop layers, thus substantially preventing the downward diffusion of the SiP during the high temperature processes. The etch stop layers 108, 110 may also be chosen to have a high resistivity. For example, carbon-doped silicon may have a higher resistivity than non-doped silicon. Thus, when carbon-doped silicon is included in the etch stop layers 108, 110, the higher resistivity may cause the carbon-doped silicon to electrically isolate the source region 104, drain region 106, or nanowire channel 102 from the well 112 (e.g., a P-well) formed in the semiconductor substrate.

Figure 1D:
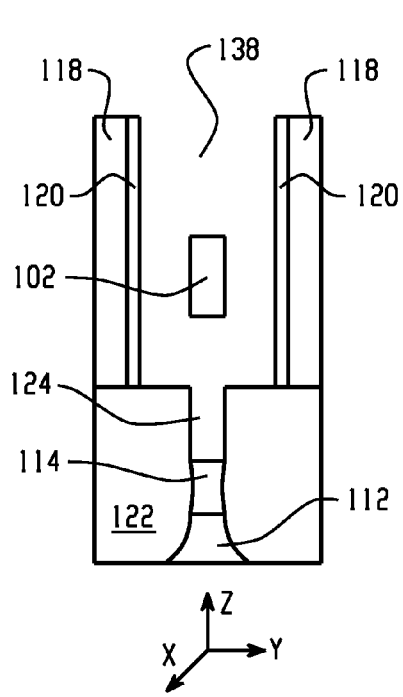

FIG. 1B depicts a cross-sectional slice of the structure depicted in FIG. 1A, with the structure of FIG. 1A being rotated 90 degrees in FIG. 1B. FIG. 1D depicts a cross-sectional slice of the structure depicted in FIG. 1C, with the structure of FIG. 1C being rotated 90 degrees in FIG. 1D. As depicted in FIGS. 1B and 1D, the sacrificial layer 114 may be located beneath the nanowire channel 102, such that when the sacrificial layer 114 is removed, the nanowire channel 102 may be suspended above the void region 124. FIGS. 1B and 1D also depict the semiconductor substrate 122 and the well 112 formed therein. The semiconductor substrate may include shallow trench isolation (STI) regions formed therein as part of the FET fabrication process. The trench 138 may be surrounded by the ILD layer 118 and the spacer material 120 that extend down to the semiconductor substrate 122 in the views of FIGS. 1B and 1D.

FIGS. 2A, 2B, 2C, and 2D are diagrams illustrating an example method for fabricating a nanowire-based FET with etch stop layers including a non-doped silicon layer 210. As depicted in FIGS. 2A and 2C, the nanowire-based FET may include a source region 204, a drain region 206, and a nanowire channel 202 that connects the source and drain regions 204, 206. The source region 204 and the drain region 206 may each comprise silicon phosphide (SiP), among other materials. The nanowire channel 202 may comprise a silicon nanowire, among other types. The FET, in a completely fabricated state, may include a gate (not depicted in FIGS. 2A-2D) that surrounds the nanowire channel 202, such that the FET may be a gate-all-around (GAA) FET.

FIG. 2A may depict a cross-sectional view of an example intermediate stage in the fabrication of the nanowire-based FET. In particular, FIG. 2A may depict the state of the FET after removal of a dummy gate structure, where removal of the dummy gate structure defines a trench 238 that distinguishes the nanowire channel 202 from the source and drain regions 204, 206 of the device. As depicted in FIG. 2A, interlayer dielectric (ILD) layers 218 may be formed above the source and drain regions 204, 206. Optional spacers 220 may be formed in the trench 238, where the spacers 220 may be disposed between the source and drain regions 204, 206 and the device gate to be formed in the trench 238.

A sacrificial layer 214 (e.g., comprising $Si_{1-x}Ge_x$, where x is within a range of approximately 20-55%) may be formed beneath the nanowire channel 202 and substantially over a semiconductor substrate. The semiconductor substrate may include a well 212 of a first conductivity type, where the well 212 may be formed via an implantation process. In the well 212, an ion-implanted anti-punch-through (APT) layer 216 may be formed. The APT layer 216 may be of the first conductivity type or a second conductivity type. The nanowire channel 202 may be released from the semiconductor substrate by etching the sacrificial layer 214 beneath the nanowire channel 202. This is depicted in FIG. 2C, where the sacrificial layer 214 has been etched away, thus leaving a void region 224 in the place of the sacrificial layer 214.

FIGS. 2A and 2C further depict etch stop layers 208, 210 that may be formed beneath the source and drain regions 204, 206 of the structure. The etch stop layers 208, 210 may comprise support structures that are located between the semiconductor substrate and the source and drain regions 204, 206. Etch stop layer 208 may include, for example, carbon-doped silicon that may be similar to the carbon-doped silicon described above for FIGS. 1A-1D. The carbon-doped silicon of the etch stop layer 208 may be adjacent to the source and drain regions 204, 206, and may be stacked vertically over the etch stop layer 210. The carbon-doped silicon of the etch stop layer 208 may be formed using an epitaxial growth process.

The etch stop layer 210 may include, for example, non-doped silicon. The non-doped silicon of the etch stop layer 210 may be adjacent to the semiconductor substrate, as depicted in FIGS. 2A and 2C. Specifically, in certain examples, the non-doped silicon of the etch stop layer 210 may be adjacent to the APT layer 216 or to other portions of the well 212. A thickness of the non-doped silicon layer 210 may be greater than a thickness of the carbon-doped silicon layer 208, as depicted in FIGS. 2A and 2C. Alternatively, the thickness of the non-doped silicon layer 210 may be less than the thickness of the carbon-doped silicon layer 208, or the layers 208, 210 may have same or similar thicknesses.

The etch stop layers 208, 210 may be selected to include materials that have a high etch rate selectivity with the sacrificial layer 214. Thus, the etch stop layers 208, 210 may be selected such that when the sacrificial layer 214 is etched to suspend the nanowire channel 202, the etch stop layers 208, 210 may be etched at a substantially lower rate as compared to the sacrificial layer 214. There may be a high etch rate selectivity between SiGe and both of carbon-doped silicon and non-doped silicon, such that carbon-doped silicon may be a suitable material for the etch stop layer 208, and non-doped silicon may be a suitable material for the etch stop layer 210, when SiGe is used as the sacrificial layer 214. The use of the etch stop layers 208, 210 may prevent etch undercutting beneath the source and drain regions 204, 206 during the removal of the sacrificial layer 214.

The etch stop layers 208, 210 may provide other functionality in the fabrication of the nanowire-based FET device. For example, in forming the FET device, high temperature processes may be used. The high temperature processes may cause the SiP of the source and drain regions 204, 206 to diffuse downward (e.g., top-to-bottom diffusion). In example structures where the etch stop layer 208 includes carbon-doped silicon that is adjacent to the source and drain regions 204, 206, the carbon-doped silicon may serve as an SiP diffusion stop layer, thus preventing the downward diffusion of the SiP during the high temperature processes. The carbon-doped silicon may prevent diffusion of the SiP to the non-doped silicon layer 210 and to other parts of the structure (e.g., the semiconductor substrate).

FIG. 2B depicts a cross-sectional slice of the structure depicted in FIG. 2A, with the structure of FIG. 2A being rotated 90 degrees in FIG. 2B. FIG. 2D depicts a cross-sectional slice of the structure depicted in FIG. 2C, with the structure of FIG. 2C being rotated 90 degrees in FIG. 2D. As depicted in FIGS. 2B and 2D, the sacrificial layer 214 may be located beneath the nanowire channel 202, such that when the sacrificial layer 214 is removed, the nanowire channel may be suspended above the void region 224. FIGS. 2B and 2D also depict the semiconductor substrate 222 and the well 212 formed therein. The trench 238 may be surrounded by the ILD layer 218 and the spacer material 220 that extend down to the semiconductor substrate 222 in the views of FIGS. 2B and 2D.

Figure 3A:
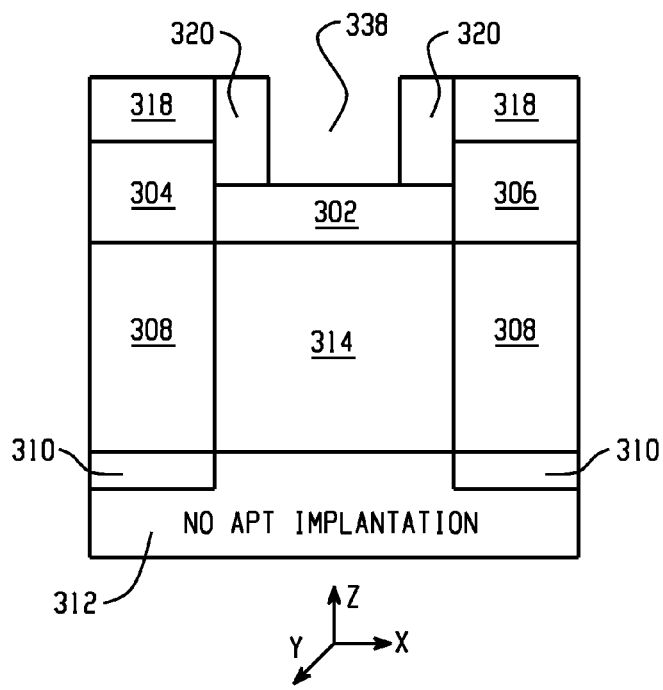
FIGS. 3A, 3B, 3C, and 3D are diagrams illustrating an example method for fabricating a nanowire-based FET with etch stop layers including a boron-doped silicon layer.
Figure 3B:
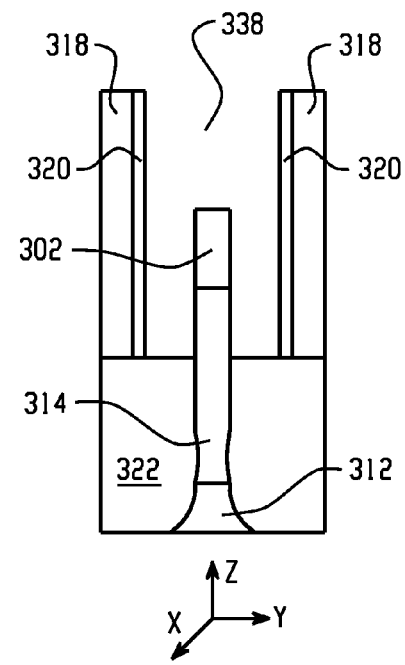
Figure 3C:
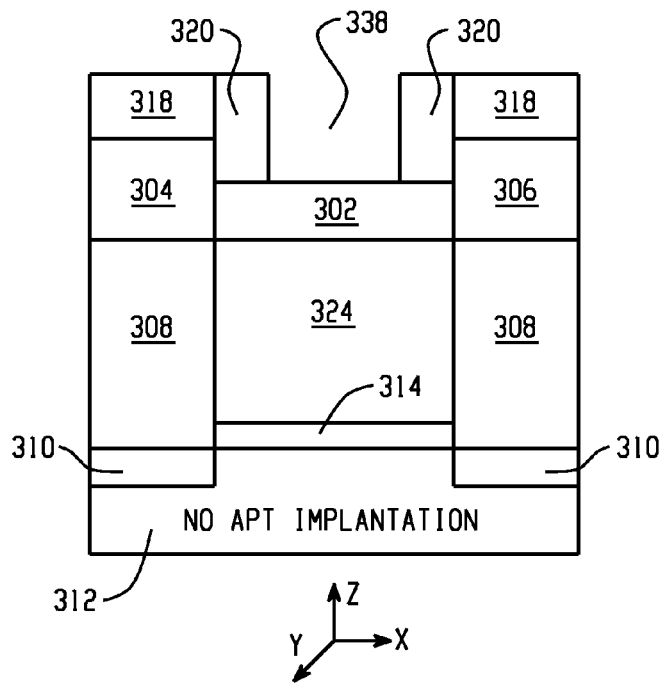

FIGS. 3A, 3B, 3C, and 3D are diagrams illustrating an example method for fabricating a nanowire-based FET with etch stop layers including a boron-doped silicon layer 310. As depicted in FIGS. 3A and 3C, the nanowire-based FET may be a gate-all-around (GAA) FET including a source region 304, a drain region 306, and a nanowire channel 302 that connects the source and drain regions 304, 306. The source region 304 and the drain region 306 may each comprise silicon phosphide (SiP), among other materials. The nanowire channel 302 may comprise a silicon nanowire, among other types. FIG. 3A may depict the state of the FET after removal of a dummy gate structure, where the removal of the dummy gate structure defines a trench 338. As depicted in FIG. 3A, interlayer dielectric (ILD) layers 318 may be formed above the source and drain regions 304, 306. Optional spacers 320 may be formed in the trench 338.

A sacrificial layer 314 including, for example, silicon germanium (SiGe), where the germanium may comprise 20-55% of the SiGe alloy (e.g., $Si_{1-x}Ge_x$, where x is within a range of approximately 20-55%), may be formed beneath the nanowire channel 302 and substantially over a semiconductor substrate. The semiconductor substrate may include a well 312 of a first conductivity type, where the well 312 may be formed via an ion implantation process. In contrast to the example structures depicted in FIGS. 1A, 1C, 2A, and 2C, the example structure of FIGS. 3A and 3C may not include an implanted anti-punch-through (APT) layer. As described in further detail below, the boron-doped silicon layer 310 may perform functions similar to those performed by an APT layer, such that the APT layer may not be formed in the example structure of FIGS. 3A and 3C. The nanowire channel 302 may be released from the semiconductor substrate by etching the sacrificial layer 314 beneath the nanowire channel 302. This is depicted in FIG. 3C, where the sacrificial layer 314 has been etched away, thus leaving a void region 324 in the place of the sacrificial layer 314.

FIGS. 3A and 3C further depict etch stop layers 308, 310 that may be formed beneath the source and drain regions 304, 306 of the structure. Etch stop layer 308 may include, for example, carbon-doped silicon, where the carbon-doped silicon of the etch stop layer 308 is adjacent to the source and drain regions 304, 306, and is stacked vertically over the etch stop layer 310. The carbon-doped silicon for the etch stop layer 308 may be formed using an epitaxial growth process.

The etch stop layer 310 may include, for example, boron-doped silicon. The boron-doped silicon of the etch stop layer 310 may be adjacent to the semiconductor substrate, as depicted in FIGS. 3A and 3C. The boron-doped silicon for the etch stop layer 310 may be formed using an epitaxial growth process. A thickness of the boron-doped silicon layer 310 may be less than a thickness of the carbon-doped silicon layer 308. Alternatively, the thickness of the boron-doped silicon layer 310 may be greater than the thickness of the carbon-doped silicon layer 308, or the layers 308, 310 may have same or similar thicknesses.

The etch stop layers 308, 310 may be selected to include materials that have a high etch rate selectivity with the sacrificial layer 314. For example, the sacrificial layer 314 may be SiGe, and the etch stop layers 308, 310 may include the above-described carbon-doped silicon and boron-doped silicon materials, respectively, that are etched at a substantially lower etch rate than the SiGe. The use of the etch stop layers 308, 310 may prevent etch undercutting beneath the source and drain regions 304, 306 during the removal of the sacrificial layer 314.

The etch stop layers 308, 310 may provide other functionality in the nanowire-based FET device. For example, the carbon-doped silicon material of the layer 308 may decrease downward diffusion (i.e., top-to-bottom diffusion) of the SiP from the source and drain regions 304, 306 following a high temperature process (e.g., a gate rounding and oxidation process). The carbon-doped silicon may thus prevent diffusion of SiP to the boron-doped silicon layer 310 and to other parts of the structure (e.g., the semiconductor substrate), for example. Further, as noted above, the epitaxially-grown boron-doped silicon layer 310 may function as an anti-punch-through (APT) layer, which may eliminate the need for an APT implant region (e.g., as depicted in FIGS. 3A and 3C, noting, "No APT Implant").

Figure 3D:
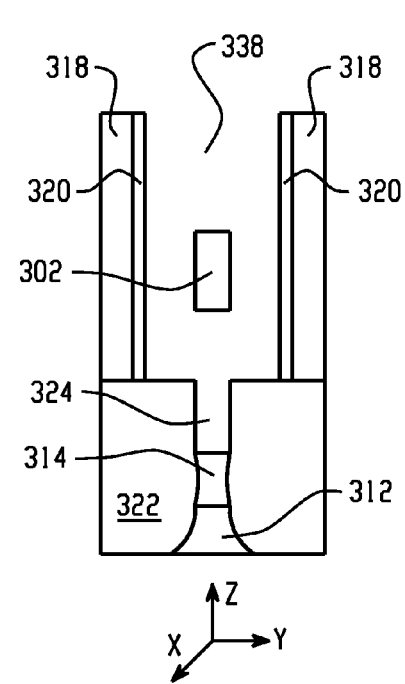

FIG. 3B depicts a cross-sectional slice of the structure depicted in FIG. 3A, with the structure of FIG. 3A being rotated 90 degrees in FIG. 3B. FIG. 3D depicts a cross-sectional slice of the structure depicted in FIG. 3C, with the structure of FIG. 3C being rotated 90 degrees in FIG. 3D. As depicted in FIGS. 3B and 3D, the sacrificial layer 314 may be located beneath the nanowire channel 302, such that when the sacrificial layer 314 is removed, the nanowire channel may be suspended above the void region 324. FIGS. 3B and 3D also depict the semiconductor substrate 322 and the well 312 formed therein. The trench 338 may be surrounded by the ILD layer 318 and the spacer material 320 that extend down to the semiconductor substrate 322 in the views of FIGS. 3B and 3D.

FIGS. 1A-1D, 2A-2D, and 3A-3D describe three example structures and methods for forming a nanowire FET. It should be recognized, however, that aspects from the three different structures and methods may be combined to form a variety of additional structures and methods. For example, one such additional structure may include etch stop layers that include a carbon-doped silicon layer, a non-doped silicon layer, and a boron-doped silicon layer that are stacked vertically. This additional structure may include an APT implant or it may not include the APT implant. Various other structures and methods may be formed by combining aspects of FIGS. 1A-1D, 2A-2D, and 3A-3D.

Figure 4:
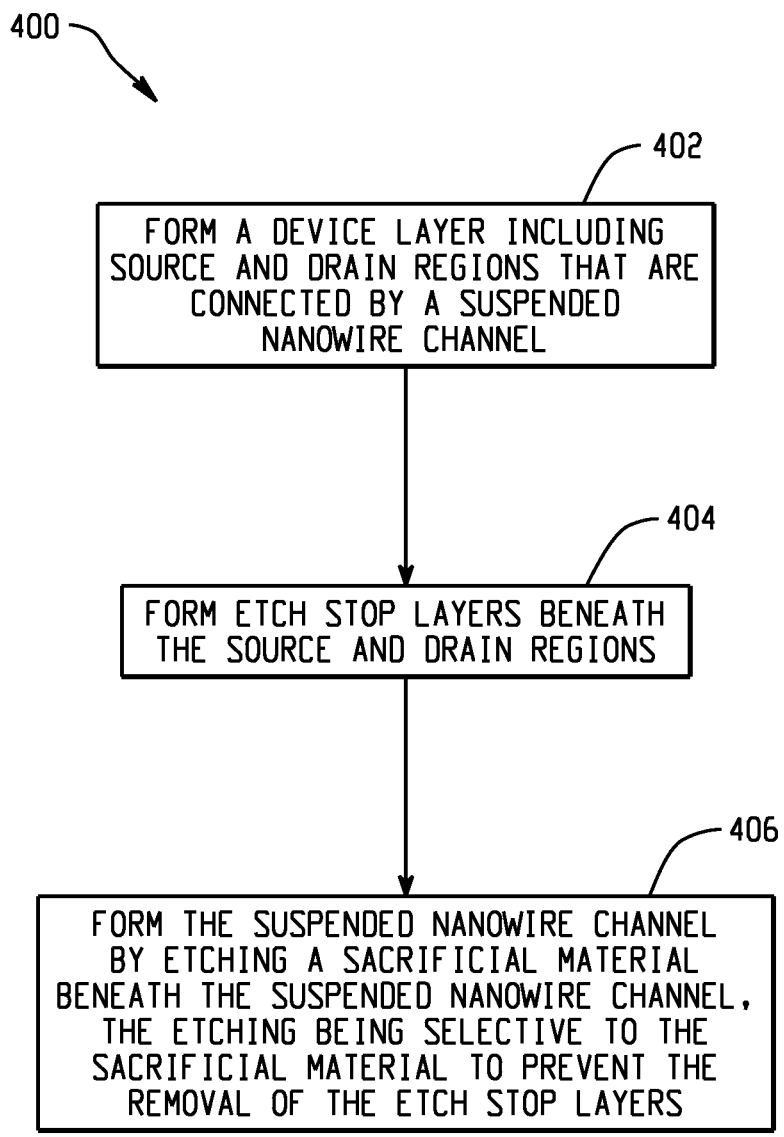
FIG. 4 is a flowchart illustrating an example method for forming a nanowire field effect transistor device.

FIG. 4 is a flowchart 400 illustrating an example method for forming a nanowire field effect transistor device. At 402, a device layer including a source region and a drain region is formed, where the source region and the drain region are connected by a suspended nanowire channel. At 404, etch stop layers are formed beneath the source region and the drain region. The etch stop layers comprise support structures interposed between a semiconductor substrate and the source and drain regions. At 406, the suspended nanowire channel is formed by etching a sacrificial material beneath the suspended nanowire channel. The etching is selective to the sacrificial material to prevent the removal of the etch stop layers beneath the source region and the drain region.

This written description uses examples to disclose the disclosure, including the best mode, and also to enable a person skilled in the art to make and use the disclosure. The patentable scope of the disclosure may include other examples. It should be understood that as used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Further, as used in the description herein and throughout the claims that follow, the meaning of "each" does not require "each and every" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive of" may be used to indicate situations where only the disjunctive meaning may apply.

What is claimed is:

1. A method for forming a nanowire field effect transistor (FET) device, the method comprising:
   forming a device layer including a source region and a drain region, the source region and the drain region being connected by a nanowire channel to be suspended the nanowire channel being provided over a sacrificial material;
   forming etch stop layers beneath the source region and the drain region, the etch stop layers comprising support structures interposed between a semiconductor substrate and the source and drain regions,
   the etch stop layers selectively including at least one of a carbon-doped silicon layer, a non-doped silicon layer, and a boron-doped silicon layer; and
   suspending the nanowire channel by:
      etching the sacrificial material beneath the nanowire channel, the etching being selective to the sacrificial material to prevent the removal of the etch stop layers beneath the source region and the drain region.

2. The method of claim 1, further comprising:
   forming the etch stop layers, wherein the etch stop layers include the carbon-doped silicon layer; and
   etching the sacrificial material, wherein the sacrificial material includes SiGe.

3. The method of claim 2, further comprising:
   forming the carbon-doped silicon layer using an epitaxial process.

4. The method of claim 2, further comprising:
   forming a well of a first conductivity type in the semiconductor substrate; and
   forming the carbon-doped silicon layer, wherein a resistivity characteristic of the carbon-doped silicon layer causes the carbon-doped silicon layer to electrically isolate the source region, the drain region, or the suspended nanowire channel from the well.

5. The method of claim 2, further comprising:
   forming a well of a first conductivity type in the semiconductor substrate;
   forming an anti-punch-through layer of the first conductivity type in the well via an implantation process; and
   forming the carbon-doped silicon layer, wherein the carbon-doped silicon layer is i) adjacent to the source region or the drain region, and ii) adjacent to the anti-punch-through layer.

6. The method of claim 5, wherein the first conductivity type is p-type.

7. The method of claim 5, wherein the first conductivity type is n-type.

8. The method of claim 2, further comprising:
   forming the source region, wherein the source region includes SiP;
   forming the drain region, wherein the drain region includes SiP; and
   forming the carbon-doped silicon layer, wherein the carbon-doped silicon layer is adjacent to the source region or the drain region, and wherein the carbon-doped silicon layer decreases diffusion of SiP to portions of the FET device.

9. The method of claim 8, further comprising:
   subjecting the device layer and the etch stop layers to a high temperature process, wherein the carbon-doped silicon layer decreases the diffusion of the SiP during the high temperature process.

10. The method of claim 2, further comprising:
    forming the etch stop layers, wherein the etch stop layers include:

the non-doped silicon layer, and
the carbon-doped silicon layer that is i) adjacent to the source region or the drain region, and ii) stacked vertically over the non-doped silicon layer.

11. The method of claim 10, further comprising:
forming the non-doped silicon layer, wherein the non-doped silicon layer is adjacent to the semiconductor substrate.

12. The method of claim 10, further comprising:
forming the source region, wherein the source region includes SiP;
forming the drain region, wherein the drain region includes SiP; and
forming the carbon-doped silicon layer, wherein the carbon-doped silicon layer decreases diffusion of SiP to the non-doped silicon layer and to the semiconductor substrate.

13. The method of claim 10, further comprising:
forming the etch stop layers, wherein a thickness of the non-doped silicon layer is greater than a thickness of the carbon-doped silicon layer.

14. The method of claim 10, further comprising:
forming a well of a first conductivity type in the semiconductor substrate;
forming an anti-punch-through layer of the first conductivity type in the well via an implantation process; and
forming the non-doped silicon layer, wherein the non-doped silicon layer is adjacent to the anti-punch-through layer.

15. The method of claim 2, further comprising:
forming the etch stop layers, wherein the etch stop layers include:
the boron-doped silicon layer, and
the carbon-doped silicon layer that is i) adjacent to the source region or the drain region, and ii) stacked vertically over the boron-doped silicon layer.

16. The method of claim 15, further comprising:
forming the boron-doped silicon layer, wherein the boron-doped silicon layer is adjacent to the semiconductor substrate.

17. The method of claim 15, further comprising:
forming the boron-doped silicon layer using a first epitaxial process; and
forming the carbon-doped silicon layer using a second epitaxial process.

18. The method of claim 15, further comprising:
forming the source region, wherein the source region includes SiP;
forming the drain region, wherein the drain region includes SiP; and
forming the carbon-doped silicon layer, wherein the carbon-doped silicon layer decreases diffusion of SiP to the boron-doped silicon layer.

19. The method of claim 15, further comprising:
forming the etch stop layers, wherein a thickness of the boron-doped silicon layer is less than a thickness of the carbon-doped silicon layer.

20. The method of claim 15, further comprising:
forming a well of a first conductivity type in the semiconductor substrate; and
forming the boron-doped silicon layer via an epitaxial process, wherein the boron-doped silicon layer serves as an anti-punch-through layer, and wherein the FET device does not include an anti-punch-through layer formed via an implantation process.

21. A transistor device comprising:
a semiconductor substrate;
a device layer including a source region and a drain region, the source region and the drain region being connected by a suspended nanowire channel; and
etch stop layers respectively arranged beneath the source region and the drain region, the etch stop layers selectively including at least one of a carbon-doped silicon layer, a non-doped silicon layer, and a boron-doped silicon layer, the etch stop layers forming support structures interposed between the semiconductor substrate and the source and drain regions,
wherein the suspended nanowire channel is formed by etching a sacrificial material beneath the suspended nanowire channel, the etching being selective to the sacrificial material to prevent the removal of the etch stop layers beneath the source region and the drain region.

22. The device of claim 21, wherein the etch stop layers respectively include the carbon-doped silicon layer arranged immediately under the source or the drain regions and serves as a diffusion stop layer.

23. The device of claim 21, wherein the etch stop layers respectively include the boron-doped silicon layer arranged immediately on a surface of the substrate and serves as an anti-punch-through layer.

* * * * *